United States Patent [19]
Mehrotra et al.

[11] Patent Number: 6,118,651
[45] Date of Patent: Sep. 12, 2000

[54] FLAT ELECTROLYTIC CAPACITOR

[75] Inventors: Vivek Mehrotra, Rye Brook; Jose Azevedo, Mahopac, both of N.Y.; Shri Sridhar, Scotch Plains, N.J.

[73] Assignee: Philips Electronics North America Corp., New York, N.Y.

[21] Appl. No.: 08/998,047

[22] Filed: Dec. 24, 1997

[51] Int. Cl.[7] .............................. H01G 9/035; H01G 9/08
[52] U.S. Cl. ..................... 361/509; 361/519; 361/504; 361/528
[58] Field of Search ...................... 361/509, 508, 361/503, 500, 512, 523, 528, 540, 529, 517, 502, 504, 516, 519, 522, 525, 532, 535, 538, 306.1; 315/58, 52

[56] References Cited

U.S. PATENT DOCUMENTS

| | | | |
|---|---|---|---|
| 1,327,593 | 1/1920 | Dubilier | 361/306.1 |
| 2,021,455 | 11/1935 | Lilienfeld | 361/531 |
| 3,518,500 | 6/1970 | Jimerson et al. | 361/531 |
| 3,611,051 | 10/1971 | Puppolo et al. | 317/230 |
| 4,933,605 | 6/1990 | Quazi et al. | 315/224 |
| 4,937,718 | 6/1990 | Murray | 362/431 |
| 5,164,635 | 11/1992 | De Jong et al. | 315/58 |
| 5,194,127 | 3/1993 | Endoh et al. | 204/129.85 |
| 5,198,967 | 3/1993 | Kuranuki et al. | 361/523 |
| 5,245,253 | 9/1993 | Quazi | 315/224 |
| 5,629,581 | 5/1997 | Belle et al. | 313/318.12 |
| 5,703,440 | 12/1997 | Kackmarik et al. | 315/56 |
| 5,834,899 | 11/1998 | Lovell et al. | 315/41 |
| 5,914,852 | 6/1999 | Hatanaka et al. | 361/523 |

FOREIGN PATENT DOCUMENTS

| | | | |
|---|---|---|---|
| 1002133 | 12/1976 | Canada | 334/20 |
| WO97/41577 | 11/1997 | Japan | H01G 9/028 |

*Primary Examiner*—Kristine Kincaid
*Assistant Examiner*—Eric W. Thomas
*Attorney, Agent, or Firm*—F. Brice Faller

[57] ABSTRACT

Anodized aluminum anode and cathode foils are interleaved in a stack separated by spacers saturated with electrolyte in an enclosure. The anode foils and cathode foils have tabs which protrude from the housing and are cold welded to leads outside the housing, where they are not exposed to electrolyte. This permits using copper leads, which can be soldered to traces on a printed circuit board. A flat capacitor can be fixed underneath a PCB or even used as the substrate for a circuit, resulting in high volume efficiencies and the possibility of using it as a heat sink for other components.

18 Claims, 5 Drawing Sheets

FLAT ELECTROLYTIC CAPACITOR

BACKGROUND OF THE INVENTION

The present invention relates to a flat electrolytic capacitor having interleaved aluminum anode and cathode foils in an enclosure containing electrolyte.

For high frequency applications a flat capacitor is desirable because it can achieve lower impedance than foils wound in a coil to form a cylindrical capacitor. Canadian Patent No. 1,002,133 discloses a flat capacitor having interleaved anode and cathode foils in a stack. At least the anode foils are anodized, and the edges are deformed during cold welding to an aluminum lead in order to displace the oxide formed in the anodizing process. Only aluminum leads are disclosed. While the patent states that the casing may be filled with electrolyte and sealed, this prohibits the use of copper leads, because the weld joints are necessarily in the casing, and the electrolyte attacks and dissolves copper. As such an electrolytic capacitor having copper leads cannot be achieved. This is a disadvantage, because aluminum cannot be soldered. Therefore an electrolytic capacitor according to this patent cannot be directly soldered to a printed circuit board.

In power supplies such as ballasts for lamps and battery chargers, capacitors are necessary for power balancing between a 50 Hz or 60 Hz input and a load which requires a constant voltage output. Lower parasitic inductance is not especially important for these applications because frequencies are low. However using a flat capacitor would be advantageous to miniaturize the ballast or other power converters. Thus it would be advantageous to be able to solder the leads to a printed circuit board.

SUMMARY OF THE INVENTION

According to the invention, the anode foils and the cathode foils have tabs which protrude from an enclosure containing the foils, spacers between the foils, and electrolyte. The tabs are conductively attached to the tabs outside of the enclosure. Since the attachment points are not exposed to electrolyte, copper leads (preferably tinned copper) may be used. As such the flat capacitor according to the invention may readily be soldered to a printed circuit board. The volume of a circuit assembly can be minimized by mounting the capacitor against the underside of the PCB, or further minimized by using the capacitor itself as a substrate for the circuit. In the latter case the flat exterior wall of the capacitor is provided with a polyimide layer having circuit traces thereon; the polyimide layer is glued directly to the capacitor. Alternatively the capacitor can be used as part of the box containing a power supply, or as an insulated metal. In any event the use of a flat capacitor permits a high stored energy density (J/cc) by minimizing the wasted volume. When used in a power supply, the lower profile permits a higher power density (Watts/cubic inch) of the power supply.

When the flat capacitor is used as a board for a circuit assembly, its outside walls are preferably made of aluminum so that it acts as a heat sink for the other components. Naturally, the anode and cathode foils are electrically isolated from these walls. The capacitor should be used as a heat sink as long as its temperature cannot exceed 90° C.

The flat geometry also allows for much easier thermal isolation of the capacitor. Whether to thermally isolate or couple the flat capacitor is dictated by the conditions under which the power supply will run and on the temperature of the other components in the power supply.

Where a power supply such as a lamp ballast requires two or more capacitors, all of the capacitors may be combined into one package. This may lead to a cost reduction. These and additional advantages will be apparent from the drawings and description which follow.

DESCRIPTION OF THE PREFERRED EMBODIMENTS

Figure 1:
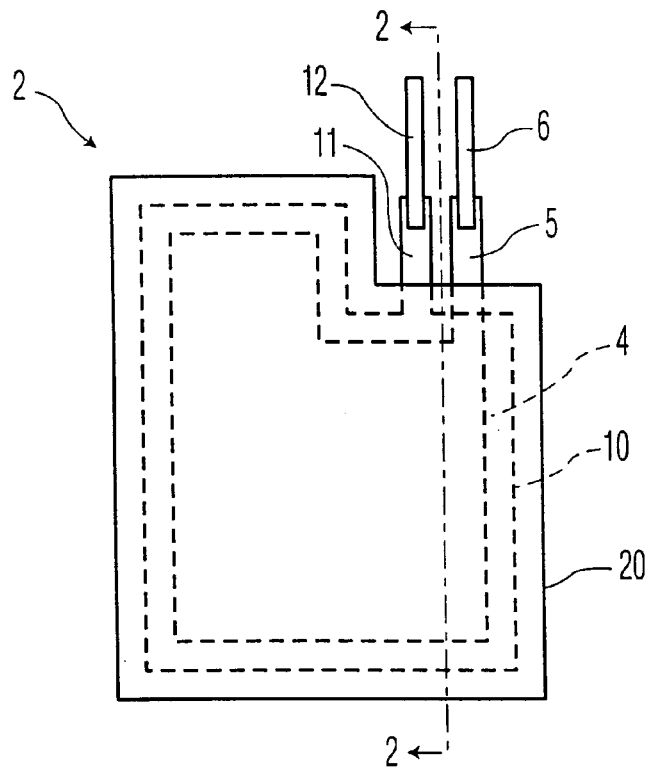
FIG. 1 is a schematic plan view of the flat electrolytic capacitor according to the invention.

Referring to FIG. 1, the flat electrolytic capacitor 2 includes a stack of aluminum anode foils 4 interleaved with a stack of aluminum cathode foils 10 in an enclosure 20. The anode foils are typically about 10 $\mu$m thick, while the cathodes are 2 $\mu$m thick (including oxide layers), as traditionally used in cylindrical capacitors. The anode foils 4 have tabs 5 extending outside of the enclosure 20, the tabs 5 being aligned one above the other and cold welded to a copper lead 6. The cathode foils 10 have tabs 11 extending outside the enclosure 20, the tabs 11 being aligned one above the other and cold welded to a copper lead 12. Since both the anode and cathode foils are oxidized—the anode foil being anodized to achieve a thicker dielectric layer—the oxide must be ground away on the tabs to permit welding. The planar dimensions of the capacitor are about 2" by 1.5" for a 22 $\mu$F 400V capacitor, smaller dimensions being possible.

Figure 2:
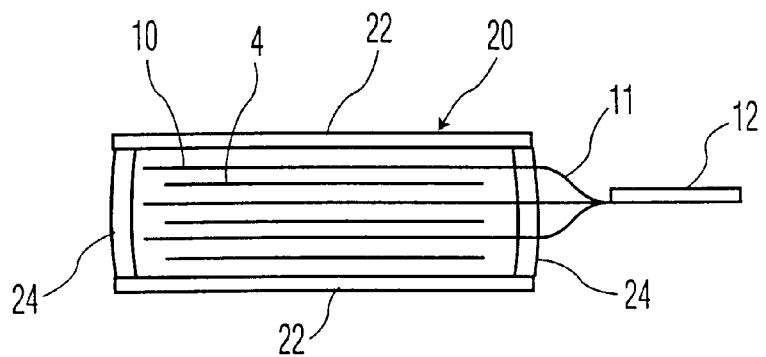
FIG. 2 is a section view taken along the line 2—2 of FIG. 1 (thickness exaggerated)

FIG. 2 is a cross section of the flat capacitor, the thickness being greatly exaggerated for clarity. The actual thickness is on the order of 2 mm. The enclosure includes exterior flat outside walls 22 which may be plastic or aluminum, the former providing better thermal isolation, the latter providing better thermal coupling. The electrodes are separated by spacers 16 (FIG. 3) which are impregnated with liquid electrolyte. The edges of the walls 20 are sealed together by a seal 24, preferably an epoxy adhesive, such as Scotch-Weld (3M), which retains the electrolyte. The area where the tabs pass through the seal is provided with a rubber grommet (not shown) which permits any vapors to escape. Alternatively, the entire seal could be semi-permeable.

Figure 3:
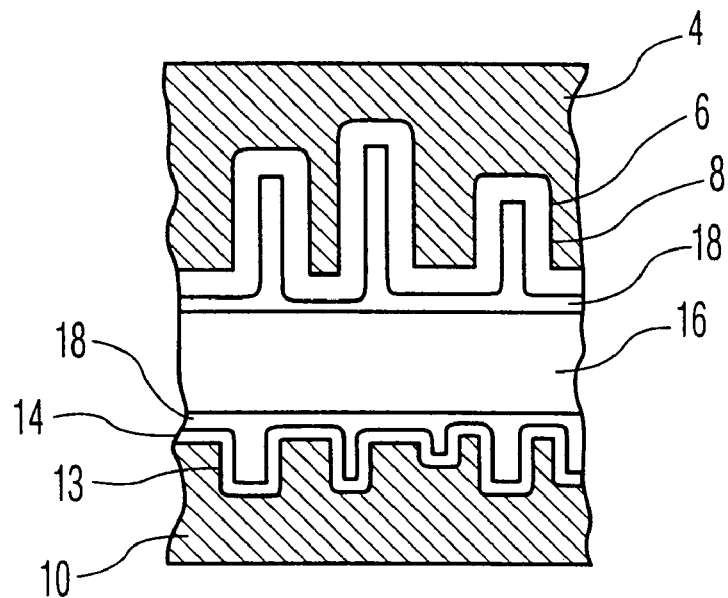
FIG. 3 is an enlarged section of an anode foil, cathode foil, and paper therebetween.

FIG. 3 shows the mutually facing surfaces of an anode foil 4 and a cathode foil 10. The anode foil 4 has etched channels 6 and an oxide layer 8. The cathode foil 10 has etched channels 13 and an oxide layer 14. A spacer 16 of the electrolyte absorbing paper is placed between the electrodes, and the remaining space, including the channels, is filled with electrolyte 18. This is preferably an aqueous glycol based electrolyte as typically used in cylindrical electrolytic capacitors. While liquid electrolyte is used in this example, solid state electrolyte is also within the purview of the invention.

Recall that capacitance $C=\epsilon A/d$, where E is the dielectric constant in the space between plates, A is the surface area of the plates, and d is the distance between plates. The more deeply channels 6 and 13 are etched, the greater the area A of the charge carrying surface and therefore the capacitance. This dictates using aluminum, which is cheap and readily etched. However, if the aluminum foils are rolled to form a cylindrical capacitor, the foils can crack at deeply etched channels. Herein lies an advantage of the invention, because foils laid flat are less apt to crack. Also, because dielectric layers of $Al_2O_3$ are brittle, the dielectric layers are less apt to crack. Thus thicker dielectric layers may be used, and high voltage electrolytic capacitors—over 450V—are possible. For a 600V capacitor, the thickness of the dielectric layer should be 1.5 times the thickness for 450V.

Figure 4:
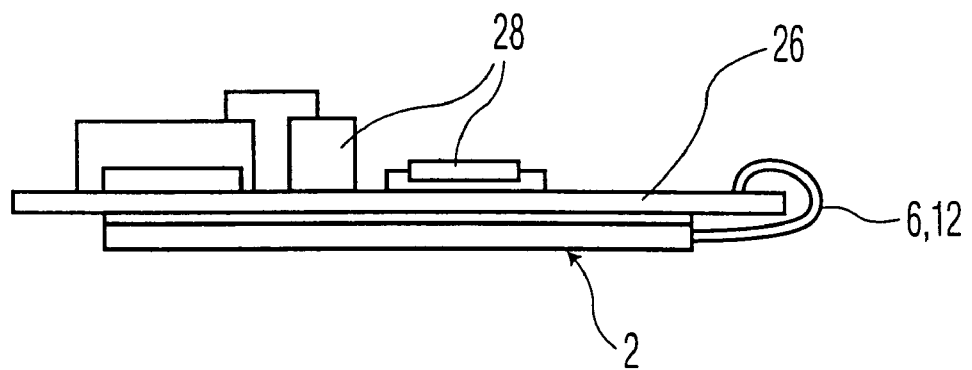
FIG. 4 is a side view of the flat capacitor mounted under a printed circuit board.
Figure 4A:
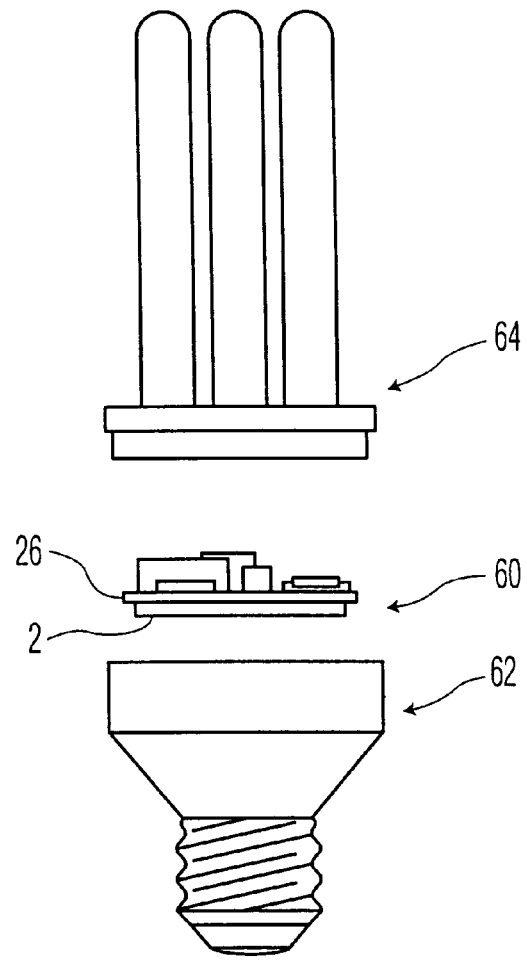
FIG. 4A is an exploded side view of a flourescent lamp having a screw base.

FIG. 4 shows a flat capacitor 2 bonded to the underside of a printed circuit board 26 with components 28 mounted thereon. In an actual 60 W AC-DC boost module, the power converter is only 0.58" high. A similar module using a cylindrical capacitor mounted on top of the PCB with its cylindrical surface against the board is 0.85" high. Expressed in terms of power density, the module with flat capacitor has a power density of 40 W/in$^3$, compared to about 25 W/in$^3$ for a cylindrical capacitor. An even greater advantage in power density can be achieved when the inventive module is used in an AC-AC converter (ballast) which replaces the butterfly configuration currently used as a ballast in a screw-base type flourescent lamp. For a 32 W flourescent tube lamp which replaces a 150 W incandescent bulb lamp, the module with a flat capacitor is fully 0.5" shorter than the butterfly module. The overall height of the lamp is therefore closer to the height of a light bulb which it replaces. FIG. 4A illustrates such a miniaturized ballast 60 as fitted into a screw base 62 for powering three looped flourescent tubes 64.

Figure 5:
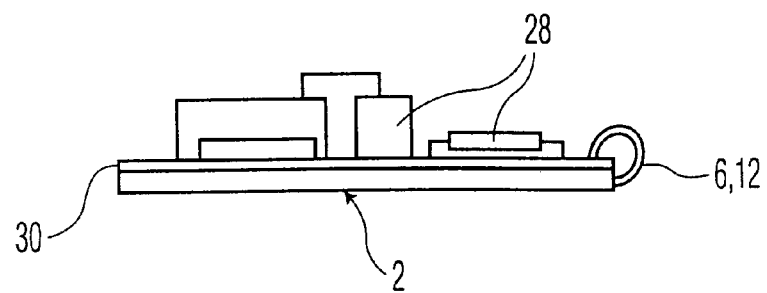
FIG. 5 is a side view of the flat capacitor itself used as a substrate for the circuit components.

FIG. 5 shows a flat capacitor 2 used as an actual substrate for components 28 in a miniature ballast. A polyimide layer 30 having circuit traces thereon is bonded to the flat capacitor 2, and the components (as well as the capacitor) are soldered to the traces.

Figure 6:
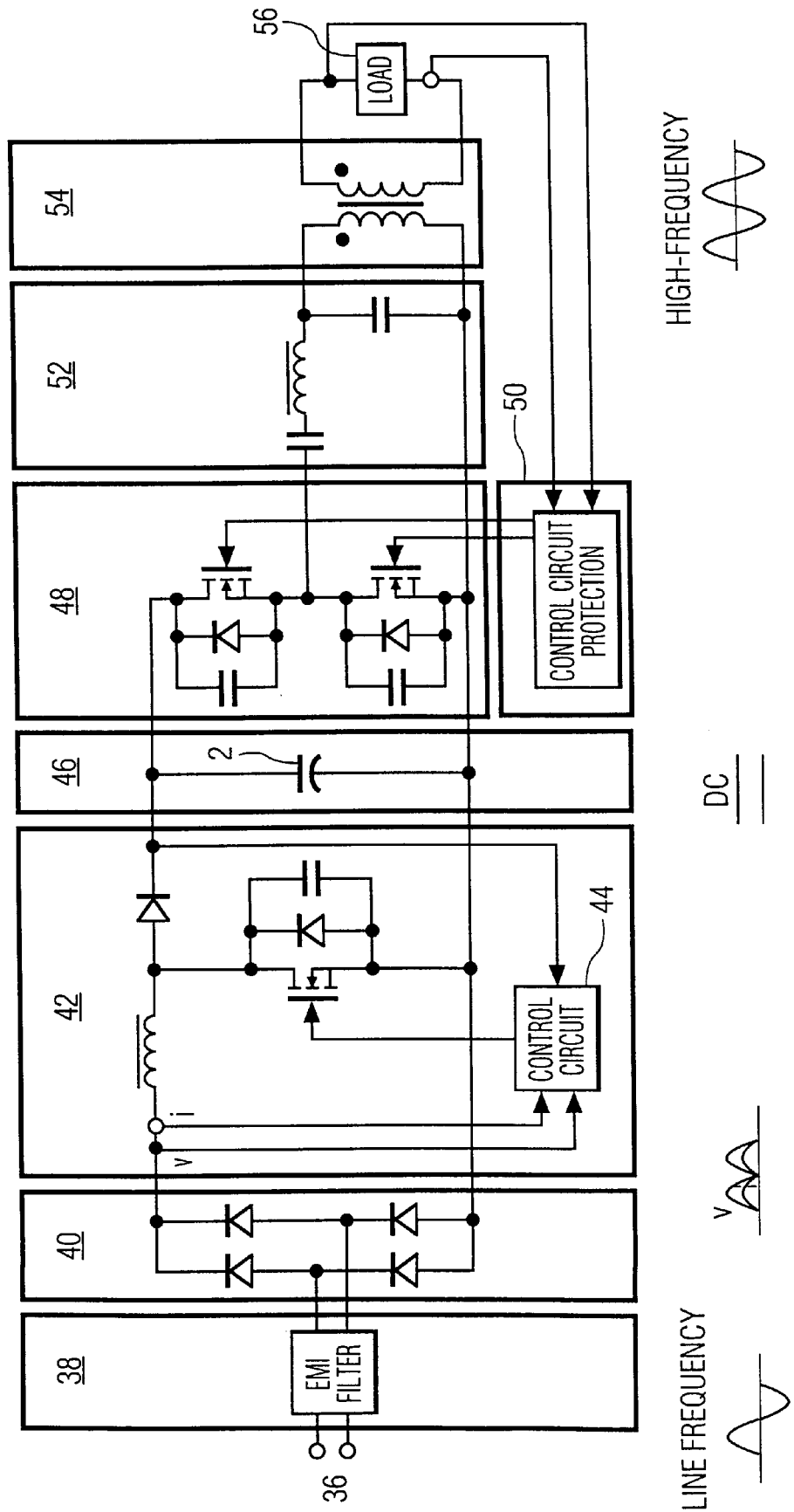
FIG. 6 is a block diagram of a lamp ballast in which the flat capacitor can advantageously be used.

FIG. 6 shows a block diagram of a lamp ballast which may incorporate a boost module according to the invention. A 60 Hz AC power supply is provided via lines 36; the waveform of the incoming voltage is depicted below. After passing through an EMI filter 38, the voltage is rectified in rectifier 40 to produce the positive voltage waveform shown below. Following this is the power correction boost converter 42, which incorporates a control circuit 44, and then the energy storage block 46 incorporating a capacitor 2 according to the invention. The blocks 42, 46 are collectively referred to as a boost module, which produces a DC waveform of a substantially constant voltage (DC offset voltage) as shown below. This voltage actually undulates somewhat as the capacitor charges and discharges, the deviation being the ripple voltage. (The ripple voltage decreases with increasing capacitance of the energy storage capacitor). Following the boost module is the DC-AC inverter 48, ignitor circuit 52, and isolation circuit 54 which provides high frequency AC power to drive the load 56; voltage taps provide feedback to a control circuit 50 which governs the lamp current in the inverter circuit 48. Note that this ballast constitutes a very specific example. Use of the flat capacitor in numerous other ballast designs is contemplated by the invention.

Figure 7:
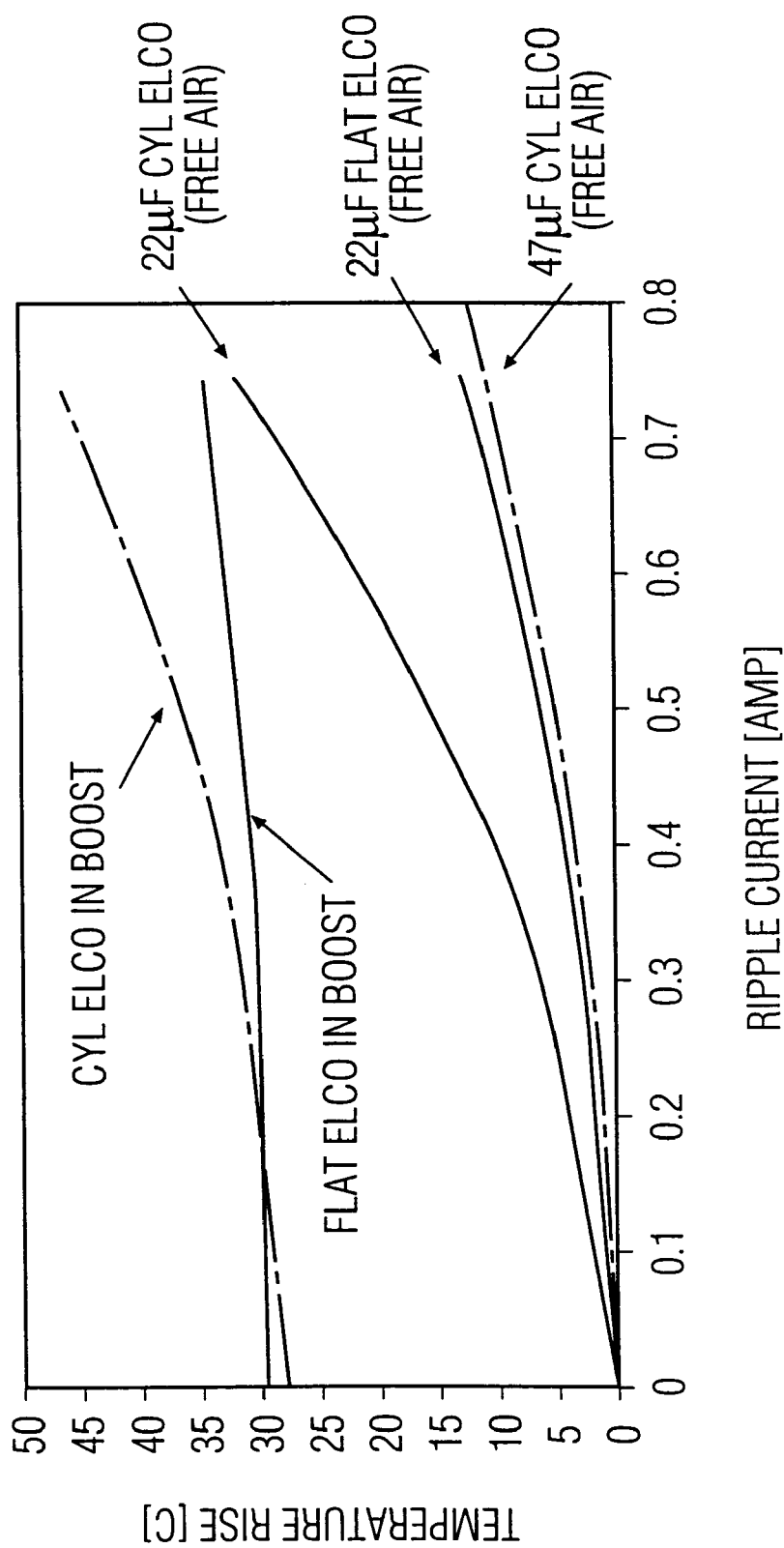
FIG. 7 is a graph of core temperature rise for cylindrical and flat electrolytic capacitors.

FIG. 7 compares the performance of flat and cylindrical electrolytic capacitors in free air and in the environment of a boost module. The three curves for free air represent an observed temperature rise in the core of the capacitors above ambient as a function of ripple current in the capacitor, while the boost curves are taken from a model in which other components lose heat to the capacitors.

The curves for free air show that a cylindrical 22 $\mu$F electrolytic capacitor (elco) undergoes a temperature rise of about 15° C. at a ripple current of 500 milliamps, while a 22 $\mu$F flat elco undergoes a temperature increase of about 6° C. This is comparable to the temperature increase for a 47 $\mu$F cylindrical elco. The curves for a modeled boost module compare 22 $\mu$F capacitors, and show a 6° C. difference in temperature rise at 500 mA. The heat dissipation properties are superior to a cylindrical capacitor because the ratio of surface area to capacitance is higher. For 22 $\mu$F capacitors, the external surface area of the flat capacitor is 2.5 times greater.

Since the life of a capacitor is determined primarily by the temperatures to which it is exposed, the test results establish that a flat capacitor may be substituted for a cylindrical capacitor of greater capacitance. Less capacitance means smaller size, so the flat capacitor achieves volume efficiencies not only by having a lower profile, but by permitting use of a smaller capacitance. The lower volume is due in part to the elimination of a central mandrel used to wind the foils in a cylindrical capacitor. The foregoing is exemplary and not intended to limit the scope of the claims which follow.

What is claimed is:

1. An electrical component including a flat electrolytic capacitor, said capacitor comprising:

a plurality of etched and anodized aluminum anode foils, arranged in a stack, each anode foil having a tab which is aligned with the tabs of the other anode foils, said anode foils being etched prior to being anodized;

a plurality of aluminum cathode foils interleaved with said anode foils, each cathode foil having a tab which is aligned with the tabs of the other cathode foils;

a plurality of spacers interleaved with said anode and cathode foils, each spacer being situated between one of said anode foils and one of said cathode foils;

an enclosure surrounding said anode foils and said cathode foils, said enclosure having flat exterior walls parallel to said foils, said tabs protruding from said enclosure;

an electrolyte lying between said anode foils and said cathode foils, said electrolyte being contained by said enclosure; and a pair of leads conductively attached to said tabs of respective anode and cathode foils outside of said enclosure, said electrical component further comprising a circuit mounted on said enclosure, said capacitor being incorporated in said circuit by means of said leads.

2. An electrical component as in claim 1, wherein said electrolyte is liquid electrolyte.

3. An electrical component as in claim 2, wherein said spacers are paper which absorbs said electrolyte.

4. An electrical component as in claim 1, wherein said leads are copper.

5. An electrical component as in claim 1, wherein said circuit comprises a polyomide layer carrying circuit traces, said polyomide layer being glued to said enclosure.

6. An electrical component as in claim 1, wherein said enclosure comprises a metal surface to which said circuit is mounted.

7. An electrical component including a flat electrolytic capacitor, said capacitor comprising:

a plurality of aluminum anode foils, arranged in a stack, each anode foil having a tab which is aligned with the tabs of the other anode foils;

a plurality of aluminum cathode foils interleaved with said anode foils, each cathode foil having a tab which is aligned with the tabs of the other cathode foils;

a plurality of spacers interleaved with said anode and cathode foils, each spacer being situated between an anode foil and a cathode foil;

an enclosure surrounding said anode foils and said cathode foils, said enclosure having flat exterior walls parallel to said foils, said tabs protruding from said enclosure;

a liquid electrolyte lying between said anode foils and said cathode foils, said electrolyte being contained by said enclosure; and a pair of leads conductively attached to said tabs of respective anode and cathode foils outside of said enclosure.

8. An electrical component as in claim 7, wherein at least said anode foils are anodized to form a dielectric layer on the foils.

9. An electrical component as in claim 8, wherein at least said anode foils are etched prior to being anodized.

10. An electrical component as in claim 7, wherein said spacers are paper which absorbs said electrolyte.

11. An electrical component as in claim 7, wherein said leads are copper.

12. An electrical component as in claim 7, further comprising a circuit mounted on said enclosure, said capacitor being incorporated in said circuit by means of said leads.

13. An electrical component as in claim 12, wherein said circuit comprises a polyomide layer carrying circuit traces, said polyomide layer being glued to said enclosure.

14. An electrical component as in claim 12, wherein said enclosure comprises a metal surface to which said circuit is mounted.

15. An electrical component as in claim 7, wherein said component is a ballast comprising a flat substrate to which said flat electrolytic capacitor is mounted parallel to said substrate.

16. An electrical component as in claim 7, wherein said component is a fluorescent lamp having a screw base, said lamp comprising a ballast incorporating said flat electrolytic capacitor.

17. A lamp ballast comprising a flat substrate and a flat electrolytic capacitor mounted to said substrate parallel to said substrate, said capacitor comprising:

a plurality of etched and anodized aluminum anode foils, arranged in a stack, each anode foil having a tab which is aligned with the tabs of the other anode foils, said anode foils being etched prior to being anodized;

a plurality of aluminum cathode foils interleaved with said anode foils, each cathode foil having a tab which is aligned with the tabs of the other cathode foils;

a plurality of spacers interleaved with said anode and cathode foils, each spacer being situated between one of said anode foils and one of said cathode foils;

an enclosure surrounding said anode foils and said cathode foils, said enclosure having flat exterior walls parallel to said foils, said tabs protruding from said enclosure;

an electrolyte lying between said anode foils and said cathode foils, said electrolyte being contained by said enclosure; and a pair of leads conductively attached to said tabs of respective anode and cathode foils outside of said enclosure.

18. A fluorescent lamp having a screw base, said lamp comprising a ballast incorporating a flat electrolytic capacitor, said capacitor comprising:

a plurality of etched and anodized aluminum anode foils, arranged in a stack, each anode foil having a tab which is aligned with the tabs of the other anode foils, said anode foils being etched prior to being anodized;

a plurality of aluminum cathode foils interleaved with said anode foils, each cathode foil having a tab which is aligned with the tabs of the other cathode foils;

a plurality of spacers interleaved with said anode and cathode foils, each spacer being situated between one of said anode foils and one of said cathode foils;

an enclosure surrounding said anode foils and said cathode foils, said enclosure having flat exterior walls parallel to said foils, said tabs protruding from said enclosure;

an electrolyte lying between said anode foils and said cathode foils, said electrolyte being contained by said enclosure; and a pair of leads conductively attached to said tabs of respective anode and cathode foils outside of said enclosure.

* * * * *